United States Patent [19]
Cheatham, Jr. et al.

[11] 4,258,313
[45] Mar. 24, 1981

[54] SOCKET TEST DEVICE FOR TESTING THREE WAY LAMP SOCKETS

[76] Inventors: Welford T. Cheatham, Jr., 1216 N. Alden St., Philadelphia, Pa. 19131; Franklin P. Ryan, Sr., 503 W. Carpenter La., Philadelphia, Pa. 19119

[21] Appl. No.: 948,496
[22] Filed: Oct. 4, 1978
[51] Int. Cl.³ .................. G01R 31/02; G01R 19/155
[52] U.S. Cl. ....................................... 324/51; 324/133
[58] Field of Search ............... 324/51, 53, 72.5, 133, 324/149, 28 R, 122

[56] References Cited
U.S. PATENT DOCUMENTS

| 524,844 | 8/1894 | Smith | 324/51 |
|---|---|---|---|
| 1,560,278 | 11/1925 | Mahan | 324/53 X |
| 1,881,457 | 10/1932 | Froeckman | 324/53 X |
| 1,912,185 | 5/1933 | Froeckman | 324/53 X |
| 2,474,073 | 6/1949 | Sundt | 324/122 X |
| 2,476,115 | 7/1949 | Runbaken | 324/51 |
| 2,705,773 | 4/1955 | Ward | 324/51 |
| 2,956,229 | 10/1960 | Henel | 324/133 |
| 3,331,018 | 7/1967 | Farina | 324/51 |
| 3,641,430 | 2/1972 | Williams | 324/51 |
| 4,127,807 | 11/1978 | Peplow et al. | 324/51 |

Primary Examiner—Gerard R. Strecker
Attorney, Agent, or Firm—Eugene E. Renz, Jr.

[57] ABSTRACT

The invention described herein relates to small hand held tools for testing all types of household, commercial, and industrial type lamp circuits and more particularly for detecting and isolating lamp socket failures, for determining circuit polarity, and for determining the presence or absence of circuit voltage.

6 Claims, 5 Drawing Figures

U.S. Patent   Mar. 24, 1981   4,258,313
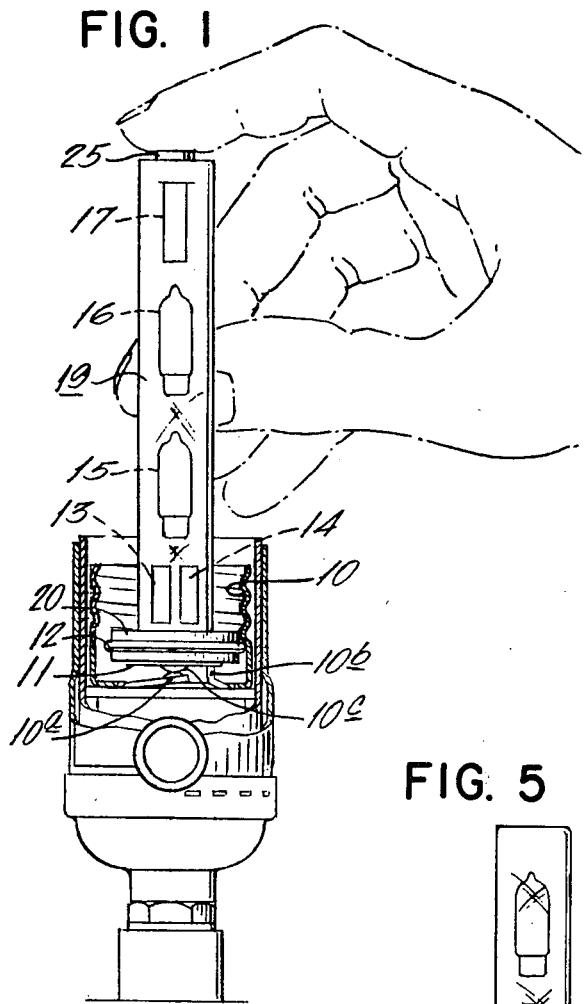
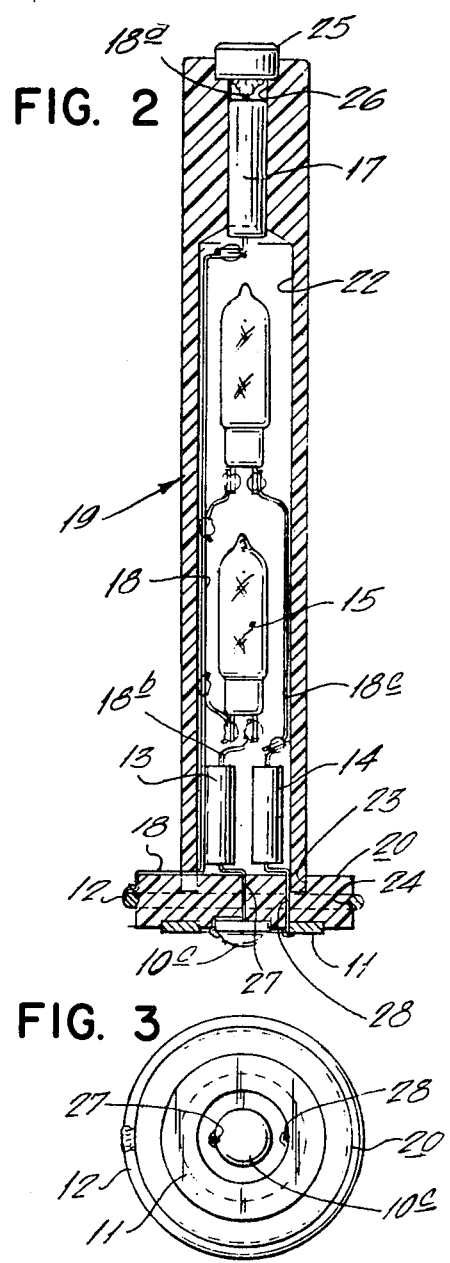
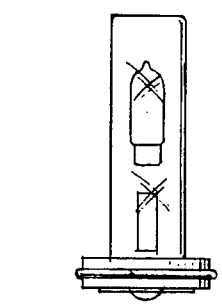
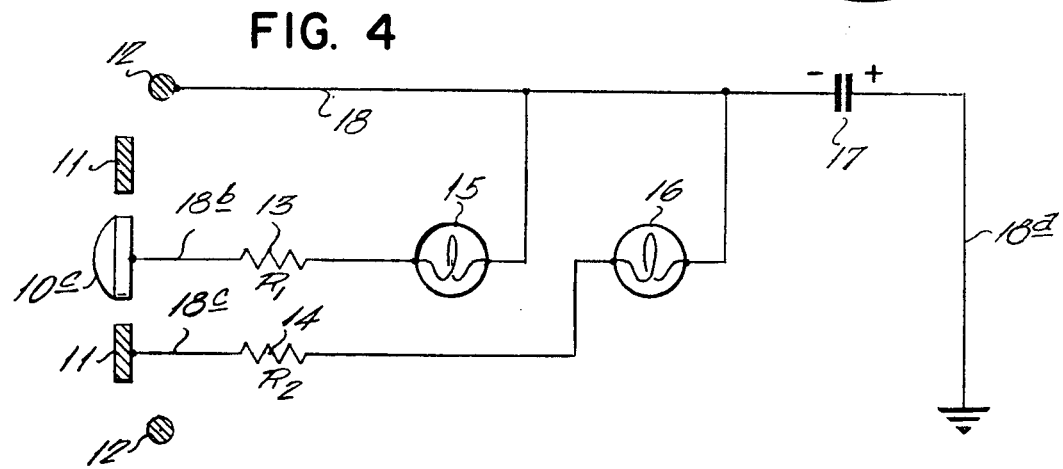

SOCKET TEST DEVICE FOR TESTING THREE WAY LAMP SOCKETS

BACKGROUND OF THE INVENTION

An object of this invention is to provide a family of circuit testers wherein the contact mating means are suitably designed to test all types of lamp circuits used in ordinary household, commercial, and industrial applications both domestic and foreign.

A further objective of this invention is to provide a family of circuit testers that precludes the use of accident prone probes, flexible wires, or conventional mechanical hand tools such as pliers, screwdrivers and the like.

Still a further objective of this invention is to provide a universal circuit tester that prevents electrical shock.

Still a further objective of this invention is to provide a universal circuit tester that can be held and applied with one hand leaving the other free.

DESCRIPTION OF THE DRAWING

Further objectives and features of this invention will become evident as details of construction and operation are explained in the detailed description. In the accompanying drawings:

FIG. 1 is a side elevation view of a simplified version of the universal tester demonstrating its application with an ordinary household lamp socket;

FIG. 2 is a cross sectional view of the simplified tester showing details of its construction and assembly;

FIG. 3 is a bottom view of the interface plate which effects contact with the lamp socket;

FIG. 4 is a diagram of the basic circuit for testing one way or three way lamp circuits; and FIG. 5 is typical electrical tester for testing a lamp circuit with a single intensity socket switch.

DESCRIPTION OF A PREFERRED EMBODIMENT

The principles of the invention apply to all types of lamp circuits and lamp socket devices. For instance, circuit testers when designed with the appropriate resistive and capacitive values and the appropriate contact or mating means provide the following type of circuit test tools:

Standard base lamp circuits
  One way light
  Three way light
Mogul base lamp circuits
  One way light
  Three way light
Bayonet base lamp circuits
Fluorescent lamp circuits
Two or three pronged power outlets Additionally, a family of similar circuit testers with the appropriate resistive and capacitive values and having appropriate contact or mating means for testing circuits using 100 to 250 V AC or DC power lines for use with domestic or foreign power sources, can be designed using the principles of the invention disclosed herein.

However, the novel features of this invention are best understood and appreciated by reference to a simplified circuit tester for ordinary household lamp circuits employing conventional and standard lamp sockets and switches and powered with ordinary 120 V AC house voltage. Thus as illustrated in FIG. 1 the typical lamp socket includes a threaded base 10 connected to ground, a first hot line contact 10a and a hot line contact 10b for a 3-way switch.

Referring to the drawings, there is shown in FIG. 4 a simplified schematic diagram of a typical three way lamp socket tester for a standard base light fixture. In accordance with said figure, the circuit is designed to test the operability of the switch where the tester is inserted into the socket and mated with the switch active contact points. Diagnostic evaluation is made in the following manner:

Bulb 15 is energized when the switch is turned to its first position and a closed circuit path is provided between the hot line and ground via contact 10c, current limiting device 13 ($R_1$), bulb 15, conductor wire 18, and annular ground ring 12. It should be noted here that no current is allowed to pass through the operator's body at any time however small.

Bulb 15 extinguishes and bulb 16 is energized when the switch is put in its second position. Similarly, a closed current path is provided the hot line and ground via contact 11, current limiting device 14 ($R_2$), bulb 16, conductor wire 18, and annular ground ring 12.

Bulbs 15 and 16 are both energized when the switch is put in its third position and closed current paths are provided via the circuits described above.

The device of the present invention is also capable of checking polarity and giving a visual indication of an incorrect connection of the base 10 and contacts 10a and 10b. For example, incorrect polarity is indicated when bulb 16 is dimly energized with the switch engaged in its corresponding position. A closed current path is provided between the hot line and ground via annular ring 12, conductor wire 18, capacitor 17, and contact 25 in parallel with annular ring 12, wire conductor 18, bulb 16, resistor 14, $R_2$, and annular contact 11 user establishes a connection to ground through finger contact with the contact 25.

Should any of said bulbs 15 and 16 fail to energize at any of the switch positions, the switch is malfunctioning. If all switch positions fail to energize the appropriate bulb, either the switch is non-operable or power has been disrupted.

In the specific illustration described above, resistor 13, $R_1$, is 100 Kohms, resistor 14, $R_2$, is 100 kohms, bulbs 15 and 16 are neon bulbs Ne2, 9 V, and capacitor 17 is 1.0 microfarad. These values can be chosen as necessary to obtain the desired circuit characteristics appropriate for the application.

The design of the present invention broadly stated provides the following innovative features which will become apparent in the proceeding detailed description:

1. Integration of the circuit testing means, 19, neon bulbs, resistors, and capacitors into a clear plastic handle.
2. Integration of the circuit engaging means, 20 in this case, lamp socket contact surfaces, into a rigid plastic base obviating the need for probes and wires.
3. Two subassemblies which are designed for easy assembly facilitating manufacturing and thereby minimizing costs.
4. A single unattachable, rigid asembly comprised of the circuit engaging means 20 and the circuit testing means 19 which can be operated with one hand as shown in FIG. 1.
5. All plastic construction which prevents electrical shock.

The detailed description that follows applies to the specific lamp socket tester shown in FIG. 2. However, as previously indicated, circuit testing devices embodying the principles and features of this invention can be designed and manufactured for use in a wide variety of circuits.

Considering now in more detail the specific construction of the two major subassemblies, shown in the cross sectional view of FIG. 2, the handle 19 and base 20 and considering first the handle 19, this subassembly consists of the generally cylindrical clear plastic tube containing all of the preassembled electrical elements of the circuit testing means.

In the present instance, the cylindrical handle has two lengthwise concentric cylindrical cavities; 22 and 26 containing the pre-assembled circuit testing elements. The handle of the typical circuit tester illustrated in FIG. 2 is constructed of ½-inch O.D. clear polystyrene plastic approximately 3 inches long having wall thicknesses of 1/16 inches thick in the larger cavity and 3/16 inches thick in the smaller cavity. A third cavity at the top of the handle houses a metallic button 25 which is permanently affixed to the plastic handle 19, a capacitor 17, and a wire 18a. At the base of handle 19, a short lengthwise slot is provided through which conductor wire 18 is passed and soldered to annular ground ring 12. Assembly of the handle 19 is achieved by inserting the pre-assembled circuit testing elements into the appropriate cavities and soldering metallic button 25 to conductor wire 18a.

Considering now the base 20, this subassembly is also constructed of clear plastic and is configured to engage the circuit in a manner consistent with the characteristics of the electrical device. Again, referring to FIG. 2 and the typical circuit tester illustrated therein, the base 20 is a clear polystyrene plastic disc-like section 3/16 inches thick and ⅞ inches in diameter. As shown in the illustration, the base 20 is specially designed to engage and contact the active parts of a standard size, three-way switch socket of an ordinary household lamp. A centered annular groove 24 around the periphery of the base acts to house and retrain a number 14 copper wire ground contact. This contact engages the socket ground as illustrated in FIG. 1. Contact surfaces 10c and 11 are embedded on the bottom surface of base 20.

The device is capable of being made in varying sizes and shapes. In a typical unit for checking lamp sockets, contact 10c, at the center of the base 20, is 5/10 inches in diameter, generally constructed of copper with a ⅛ inch diameter hole in its center. Contact 11 which is concentric with contact 10c, is a copper washer ⅝ inches in diameter, 1/32 inches thick, and ⅛ inches wide. Contact 10c engages the low light level contact 10a of the lamp socket shown in FIG. 1 and contact 11 engages the intermediate light level contact 10b of the lamp socket also illustrated in FIG. 1. The upper surface of base 20 contains a 3/32 inch deep by 1/16 inch wide circular slot 23, which mates with the handle 19 as shown in FIG. 2 during final assembly. Two through holes 27 and 28 are provided in base 20 and as illustrated in FIG. 2 serve as pass through conducts for conductor wires 18b and 18c.

Assembly of the two subassemblies is achieved by passing through conductor wires 18, 18b and 18c. Handle 19 is then engaged in slot 23 on the upper surface of base 20 and permanently affixed. Conductor wires 18, 18b and 18c are soldered to annular ring 12 and contacts 10c and 11 respectively. The circuit tester so formed is a single unattachable, rigid assembly which can be operated with one hand giving visual indication of circuit status.

What is claimed is:

1. A socket test device for testing a socket having at least two hot line contacts and a ground comprising an elongated handle portion, a base at one end of the handle portion of a greater cross section than said handle, an annular ground ring on the periphery of said base adapted to contact the socket ground, a first hot line contact projecting from the bottom face of said base centrally thereof adapted to engage one of said socket contacts, a second annular hot line contact circumscribing said first contact adapted to engage the other socket contact, at least two light indicator means in the form of bulbs each connected in series with a current limiting device to said first and second hot line contacts respectively, one of said bulbs being energized when a closed circuit path is established between the one of said socket contacts and the socket ground via said first contact, current limiting device and annular ground ring, said second bulb being energized when a closed circuit path is established between the other of said socket contacts and the socket ground via said second contact, current limiting device and annular ground ring.

2. A socket test device as claimed in claim 1 wherein said light indicator means is mounted in a cavity in said handle portion and said handle portion is made of a translucent material so that the light means are visually detectable from exteriorly thereof.

3. A socket test device as claimed in claim 1 wherein said handle is made of a clear plastic material.

4. A socket test device as claimed in claim 1 wherein said base is of generally circular cross section.

5. A socket test device as claimed in claim 1 wherein said light indicator means are neon bulbs and said current limiting devices are resistors.

6. A socket test device as claimed in claim 1 including a capacitor mounted in the outer end of said handle and connected in said circuit, a metallic button contacting said capacitor, said circuit providing means for checking polarity when said button is engaged by the user and the hot line and ground contacts are connected to the corresponding hot line and ground portions of a circuit to be tested.

* * * * *